(12) United States Patent
Kim et al.

(10) Patent No.: US 11,155,724 B2
(45) Date of Patent: Oct. 26, 2021

(54) INK COMPOSITION, PREPARATION METHOD OF THE SAME, AND FABRICATION METHOD OF WINDOW MEMBER USING THE SAME

(71) Applicants: Samsung Display Co., Ltd., Yongin-Si (KR); DONG YANG INK CO., LTD., Pyeongtaek-si (KR)

(72) Inventors: Dongho Kim, Hwaseong-si (KR); Jiwon Choi, Pyeongtaek-Si (KR)

(73) Assignees: SAMSUNG DISPLAY CO., LTD., Gyeonggi-Do (KR); DONG YANG INK CO., LTD., Gyeonggi-Do (KR)

( * ) Notice: Subject to any disclaimer, the term of this patent is extended or adjusted under 35 U.S.C. 154(b) by 219 days.

(21) Appl. No.: 16/199,374

(22) Filed: Nov. 26, 2018

(65) Prior Publication Data

US 2019/0161630 A1    May 30, 2019

(30) Foreign Application Priority Data

Nov. 28, 2017    (KR) ......................... 10-2017-0160894

(51) Int. Cl.
| | | |
|---|---|---|
| C09D 11/102 | (2014.01) | |
| C09D 11/037 | (2014.01) | |
| H01L 27/32 | (2006.01) | |
| H01L 51/52 | (2006.01) | |
| C09D 11/033 | (2014.01) | |
| C08G 59/00 | (2006.01) | |
| C08G 59/16 | (2006.01) | |
| C08G 59/50 | (2006.01) | |
| C08G 59/14 | (2006.01) | |
| C08G 59/32 | (2006.01) | |

(52) U.S. Cl.
CPC ............ *C09D 11/102* (2013.01); *C08G 59/00* (2013.01); *C08G 59/1455* (2013.01); *C08G 59/1477* (2013.01); *C08G 59/3227* (2013.01); *C08G 59/50* (2013.01); *C09D 11/033* (2013.01); *C09D 11/037* (2013.01); *H01L 27/323* (2013.01); *H01L 27/3244* (2013.01); *H01L 51/524* (2013.01); *H01L 51/5237* (2013.01)

(58) Field of Classification Search
CPC ... C09D 11/102; C09D 11/037; C09D 11/033; C08G 59/00; C08G 59/1455; C08G 59/50; C08G 59/1477; C08G 59/3227; H01L 27/3244; H01L 51/524; H01L 27/323; H01L 51/5237
See application file for complete search history.

(56) References Cited

U.S. PATENT DOCUMENTS

2017/0096564 A1* 4/2017 Seeger .................... B05D 5/00
2020/0087442 A1* 3/2020 Tobe .................. C08G 59/4276

FOREIGN PATENT DOCUMENTS

| | | |
|---|---|---|
| JP | 2017129633 A | 7/2017 |
| KR | 101444374 B1 | 9/2014 |
| KR | 101469719 B1 | 12/2014 |
| KR | 20150047800 A | 5/2015 |
| KR | 20150087886 A | 7/2015 |
| KR | 101762961 B1 | 7/2017 |

\* cited by examiner

*Primary Examiner* — Alexander C Kollias
(74) *Attorney, Agent, or Firm* — Cantor Colburn LLP

(57) ABSTRACT

An ink composition including an epoxy resin, and an amine curing agent. The epoxy resin is formed by reacting a bifunctional epoxy monomer, an adipic acid, and a polyisocyanate. The ink composition is formed by mixing the epoxy resin and the amine curing agent. The preparing of the epoxy resin includes mixing an epoxy functional monomer and an adipic acid to form an epoxy intermediate, and mixing the epoxy intermediate with a polyisocyanate to form the epoxy resin.

20 Claims, 8 Drawing Sheets

INK COMPOSITION, PREPARATION METHOD OF THE SAME, AND FABRICATION METHOD OF WINDOW MEMBER USING THE SAME

This patent application claims priority to Korean Patent Application No. 10-2017-0160894, filed on Nov. 28, 2017, and the benefits accruing therefrom under 35 U.S.C. § 119, the entire contents of which are hereby incorporated by reference.

BACKGROUND

1. Field

Exemplary embodiments of the present disclosure herein relate to an ink composition, a preparation method of an ink composition, and a fabrication method of a window member provided by the method, and more particularly, to an ink composition having improved adhesion properties with an adhesion member and the like, barrier properties and the like, a preparation method of the ink composition, and a fabrication method of a window member using the same.

2. Description of the Related Art

A window member for protecting a screen is installed on the front surface of the display panel such as a liquid crystal display panel, a plasma display panel, an organic light emitting display panel, or the like. Specifically, the window member is attached and fixed to the outer surface of the display panel such that the user may identify the user's input or the output of the device from the outside.

The window member is disposed on the outer surface of the device and directly affects the design of the device.

SUMMARY

It would be advantageous if the window member not only functioned to protect the display panel, but also if various designs could be added to the window member. A method of adding the design to the window member includes a method of forming a decorative pattern through a colored ink and a shielding ink in the bezel area. The shielding ink includes an epoxy resin, so that an adhesive force with an adhesive formed of an acryl resin may be reduced.

In some embodiments the present disclosure provides an ink composition capable of forming a shielding ink layer of which the adhesion property and the barrier property are improved and thus the physical properties are not deteriorated or otherwise adversely affected even under a high temperature and a high humidity condition.

In some embodiments the present disclosure also provides a fabrication method of a window member in which the adhesive force between each of the members constituting the window member is improved, the barrier property to block moisture and the like is improved, and thus the reliability is improved.

An embodiment provides an ink composition including an epoxy resin and an amine curing agent. The epoxy resin is a reaction product of a bifunctional epoxy monomer, an adipic acid, and a polyisocyanate.

In an embodiment, based on 100 parts by weight of the bifunctional epoxy monomer, the ink composition may include 10 to 50 parts by weight of the adipic acid, 5 to 30 parts by weight of the polyisocyanate, and 10 to 30 parts by weight of the amine curing agent.

In an embodiment, the bifunctional epoxy monomer may be a bisphenol A epoxy monomer, or a bisphenol F epoxy monomer.

In an embodiment, the polyisocyanate may be a diisocyanate, which may be isophorone diisocyanate, toluene diisocyanate, methylene phenyl diisocyanate, dimeryl diisocyanate, hexamethylene diisocyanate, or a combination thereof.

In an embodiment, the amine curing agent may be triethylene tetramine.

In an embodiment, the ink composition may further include carbon black, a carbon black dispersant, a defoamer, an isophorone solvent, a barium sulfate filler, or a combination thereof.

In an embodiment, the epoxy resin may include a urethane bond, wherein the urethane bond may include a hydrogen atom connected to a nitrogen atom.

An embodiment provides a preparation method of an ink composition, the method including: preparing an epoxy resin, and mixing an amine curing agent with the epoxy resin. The preparing the epoxy resin includes: mixing a bifunctional epoxy monomer with an adipic acid to form an epoxy intermediate; and mixing a polyisocyanate with the epoxy intermediate to form the epoxy resin.

In an embodiment, the epoxy intermediate may include two hydroxyl groups.

In an embodiment, in the forming of the epoxy resin, the hydroxyl group of the epoxy intermediate may react with the polyisocyanate to form a urethane bond.

In an embodiment, in the forming of the epoxy resin, the bifunctional epoxy monomer may be mixed with the adipic acid at a molar ratio of 2:1.

In an embodiment, in the forming of the epoxy intermediate, the epoxy group of the bifunctional epoxy monomer may react with the carboxylic group of the adipic acid to form an ester bond.

In an embodiment, in the mixing of the amine curing agent with the epoxy resin, the epoxy group of the epoxy resin may react with the amine curing agent to form a bond.

In an embodiment, in the forming of the epoxy resin, the epoxy intermediate may be mixed with the diisocyanate at a molar ratio in a range of 1:0.30 to 1:0.45.

In an embodiment, before the mixing of the amine curing agent with the epoxy resin, the preparation method may further include mixing an isophorone solvent, a carbon black dispersant, a defoamer, a barium sulfate filler, carbon black, or a combination thereof, with the epoxy resin.

An embodiment provides a fabrication method of a window member, the method including: preparing a light transmissive member including a transmissive area through which light is transmitted and a bezel area surrounding the transmissive area; and printing a shielding ink on one surface of the light transmissive member such that the shielding ink overlaps the bezel area. The shielding ink is formed by preparing an epoxy resin, and mixing an amine curing agent with the epoxy resin. The preparing the epoxy resin includes: mixing a bifunctional epoxy monomer with an adipic acid to form an epoxy intermediate, and mixing a polyisocyanate with the epoxy intermediate to form the epoxy resin.

In an embodiment, the above method may further include attaching a waterproof member on the shielding ink. The waterproof member may include an acryl resin adhesive layer. The acryl resin adhesive layer may contact the shielding ink.

In an embodiment, the epoxy intermediate may include two hydroxyl groups. In the forming of the epoxy resin, the hydroxyl group of the epoxy intermediate may react with the polyisocyanate to form a urethane bond.

In an embodiment, the urethane bond may include a hydrogen atom connected to a nitrogen atom. The hydrogen atom may be hydrogen-boned to a hydrogen atom included in the acryl resin adhesive layer.

In an embodiment, before the printing of the shielding ink, the method may further include printing a background ink on the one surface of the light transmissive member.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
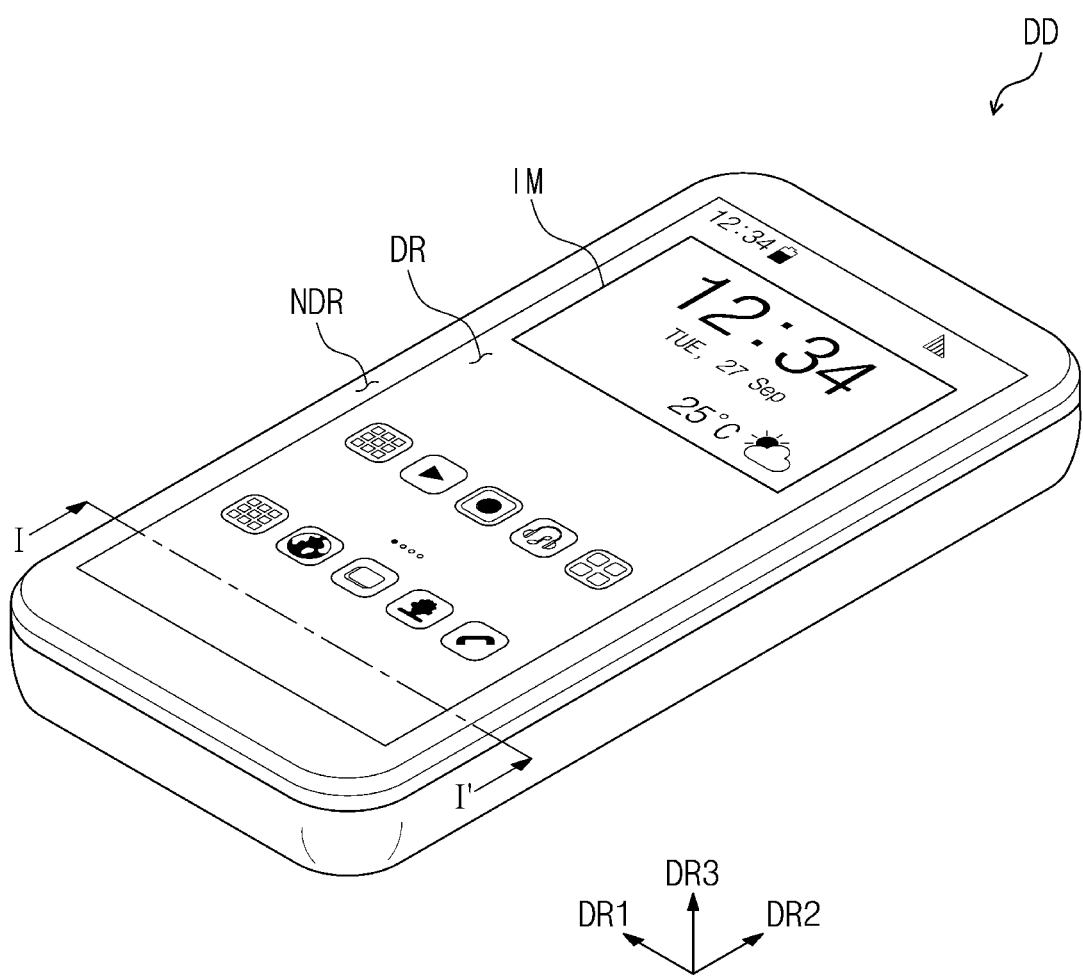
FIG. 1 is a perspective view of a display device including a window member, according to an embodiment.

Hereinafter, embodiments of the present invention will be described with reference to the drawings. In the present specification, when an element (or region, layer, portion, etc.) is referred to as being "on", "connected", or "coupled to" another element, the element may be directly connected/coupled onto another component, or a third element may be disposed therebetween.

Like reference numerals refer to like elements. Also, in the drawings, thickness, ratio, and dimensions of elements are exaggerated for an effective explanation of the technical content. "And/or" includes all combinations of one or more of which the associated configurations can define.

Although the terms first, second, etc. may be used herein to describe various elements, these elements should not be limited by these terms. These terms are only used to distinguish one element from another element. For example, without departing from the teachings of the present invention, a first element could be termed a second element, and similarly, a second element could also be termed a first element. The singular forms are intended to include the plural forms as well, unless the context clearly indicates otherwise.

Also, terms such as "under", "on the lower side", "above", "on the upper side" and the like are used to describe the relationship of the configurations shown in the drawings. The terms are described relative to the direction shown in the figure, in a relative concept.

It will be understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof. Also, when a portion of a layer, film, region, plate, etc. is referred to as being 'on' another portion, it can be directly on, or intervening the other portion may also be present. On the contrary, when a portion of a layer, film, region, plate, etc. is referred to as being 'under' another portion, it can be directly under, or intervening the other portion may also be present.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value. All ranges recited herein are inclusive of the endpoint.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"Amine" has used herein refers to a compound of the general formula NRRR, wherein each R is independently hydrogen or a C1-C36 hydrocarbon group, for example, a C1-C36 alkyl group, or a C6-C36 aryl group, provided that not all R are hydrogen.

"Acryl" as used herein includes acrylic, methacrylic, (C1 to C20 alkyl)acrylate, and (C1 to C20 alkyl)methacrylate groups.

"Crosslinked" as used herein refers to a covalent or ionic bond that links one polymer or polymer chain to another polymer or polymer chain.

The monomer in embodiments is distinguished from an oligomer and a polymer, and refers to a compound having a weight average molecular weight of 1,000 grams per mole (g/mol) or less. In the present specification, the "polymerizable functional group" refers to a group involved in the polymerization reaction, such as an epoxy group or an acryl group.

Hereinafter, an ink composition and a preparation method of the same according to an embodiment will be described.

An ink composition according to an embodiment may be used for forming a shielding ink layer of a window member. More specifically, the ink composition according to an embodiment may be printed on one surface of the window member to highlight a particular decoration, e.g., decorative, pattern formed in a bezel area of the window member.

The ink composition according to an embodiment includes an epoxy resin and an amine curing agent. The preparation method of an ink composition according to an embodiment includes preparing the epoxy resin, and mixing the amine curing agent with the epoxy resin.

In the ink composition of embodiments, the epoxy resin may indicate a compound including at least one epoxidized aliphatic ring. The epoxy resin may regulate a crosslinking density in the ink composition, thereby exhibiting the strength, durability, surface hardness and the like of the coating film, and serve to control an adhesive force and the like with other materials.

The epoxy resin is formed by reacting with a bifunctional epoxy monomer, an adipic acid, and a polyisocyanate. In the ink composition, the components may be included in amounts of, based on 100 parts by weight of the bifunctional epoxy monomer, 10 to 50 parts by weight of the adipic acid, 5 to 30 parts by weight of the polyisocyanate, preferably the diisocyanate, and 10 to 30 parts by weight of the amine curing agent. For example, the ink composition may include, based on 100 parts by weight of the bifunctional epoxy monomer, 20 to 25 parts by weight of the adipic acid, 7 to 15 parts by weight of the polyisocyanate, preferably the diisocyanate, and 10 to 15 parts by weight of the amine curing agent.

The bifunctional epoxy monomer is a monomer including two epoxy groups as a functional group. The bifunctional epoxy monomer may be, for example, a bisphenol A epoxy monomer, or a bisphenol F epoxy monomer. The bisphenol A epoxy monomer may be a monomer in which an epoxy group is connected, e.g., attached, to a phenol group positioned on both sides of bisphenol A. More specifically, the bisphenol A epoxy monomer may be represented by Formula 1-A below. The molecular weight of the bisphenol A epoxy monomer represented by Formula 1-A is 340.

Formula 1-A

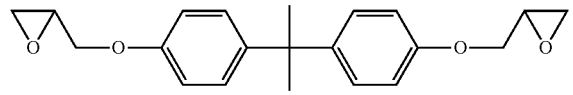

The bisphenol F epoxy monomer may be a monomer in which the epoxy group is connected to both sides of bisphenol F. More specifically, the bisphenol F epoxy monomer may be represented by Formula 1-F below. The molecular weight of the bisphenol F epoxy monomer represented by Formula 1-F is 312.

Formula 1-F

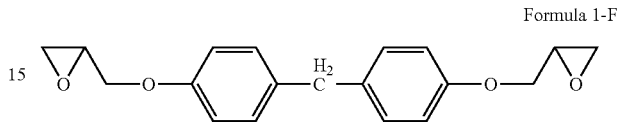

In the preparing of an epoxy resin of embodiments, the bifunctional epoxy monomer and the adipic acid are combined in any manner, e.g., mixed. The bifunctional epoxy monomer and the adipic acid may be mixed and react to form an epoxy intermediate.

The adipic acid corresponds to a dicarboxylic acid including two carboxylic groups. The adipic acid is represented by Formula 2 below. The molecular weight of the adipic acid is 146 g/mol.

Formula 2

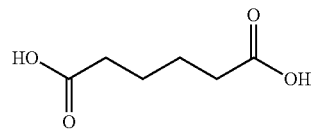

In the forming of an epoxy intermediate, the bifunctional epoxy monomer and the adipic acid may be mixed at a molar ratio of 1.5:1 to 4:1, e.g., 2:1. In the step of forming an epoxy intermediate, the epoxy group of the bifunctional epoxy monomer may react with the carboxyl group of the adipic acid and an ester bond is formed. As a result of the reaction, an epoxy intermediate including two hydroxyl groups may be formed through the reaction. For example, when the bifunctional epoxy monomer is a bisphenol A epoxy monomer represented by Formula 1-A, the epoxy intermediate may be a bisphenol A epoxy intermediate represented by Formula 3-A below. The average molecular weight of the bisphenol A epoxy intermediate is about 824 g/mol.

Formula 3-A

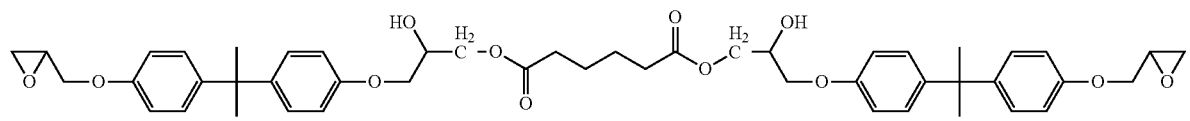

In addition, when the bifunctional epoxy monomer is a bisphenol F epoxy monomer represented by Formula 1-F, the epoxy intermediate may be a bisphenol F epoxy intermediate represented by Formula 3-F below. The average molecular weight of the bisphenol F epoxy intermediate is about 770 g/mol.

Alternatively, a trifunctional or higher functional isocyanate may be used instead of the diisocyanate as an isocyanate. For example, a triisocyanate may be used as the polyisocyanate by adjusting the amount appropriately.

The epoxy intermediate and the diisocyanate may be mixed at a molar ratio in a range of about 1:0.30 to about 1:0.45. When the diisocyanate is included at a molar ratio of less than 0.3:1, the viscosity may be insufficiently, e.g., undesirably, increased and durability of the coating film formed of the ink composition may be deteriorated. When the diisocyanate and the epoxy intermediate are mixed at a molar ratio of greater than 0.45:1, a gelation reaction may occur and a function of the composition may be lost, e.g., the composition may not function or perform as desired.

Formula 3-F

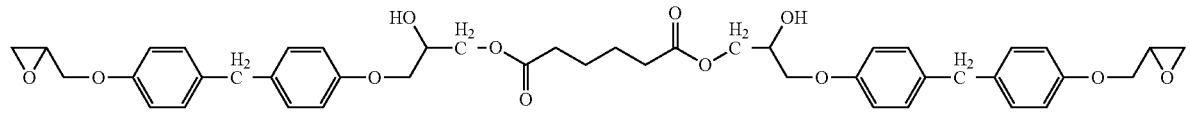

As shown in Formulae 3-A and 3-F, the epoxy intermediate may include two epoxy groups as a functional group on both sides and may include two hydroxyl groups as a functional group inside the branch.

The epoxy intermediate is mixed with a polyisocyanate, preferably a diisocyanate to form an epoxy resin. The epoxy intermediate may be crosslinked by polyisocyanate, preferably a diisocyanate to from an epoxy resin. The diisocyanate may be a bifunctional isocyanate. The diisocyanate may be, but is not limited to, isophorone diisocyanate (IPDI), toluene diisocyanate (TDI), methylene phenyl diisocyanate (MDI), dimeryl diisocyanate (DDI), hexamethylene diisocyanate (HDI), or a combination thereof. For example, the diisocyanate may be isophorone diisocyanate, and may be represented by Formula 4 below.

When the epoxy resin is formed, the polyisocyanate may react with the hydroxyl group of the epoxy intermediate to form a urethane bond. The urethane bond may include a hydrogen atom connected to a nitrogen atom. For example, when the epoxy intermediate is a bisphenol A epoxy intermediate represented by Formula 3-A, the epoxy resin may be a bisphenol A epoxy resin represented by Formula 5-A below. When the epoxy intermediate and the diisocyanate are reacted at a molar ratio of 1:0.4, the bisphenol A epoxy resin represented by Formula 5-A below has physical properties such as a solid content of 60%, a viscosity of 25,000 poise, an average molecular weight of 1,870 g/mol, and an average molecular weight distribution (polydispersity index, PDI)=2.5.

Formula 4

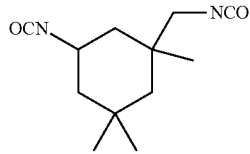

Formula 5-A

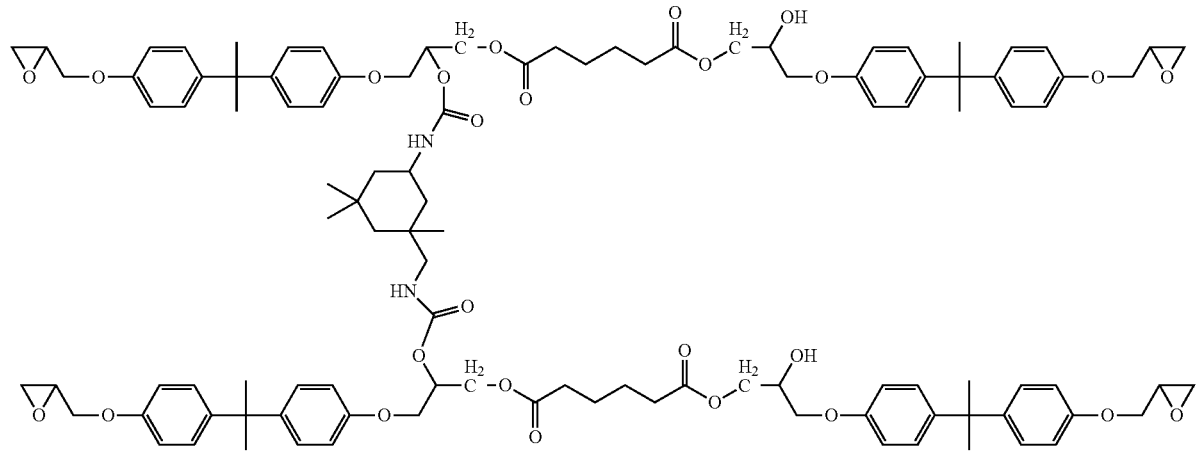

Alternatively, when the epoxy intermediate is a bisphenol F epoxy intermediate represented by Formula 3-F, the epoxy resin may be a bisphenol F epoxy resin represented by Formula 5-F below.

may have a network structure connected by a plurality of crosslinks. For example, the epoxy resin and the amine curing agent may be connected to an approximate structure represented by the schematic Formula 7 below.

Formula 5-F

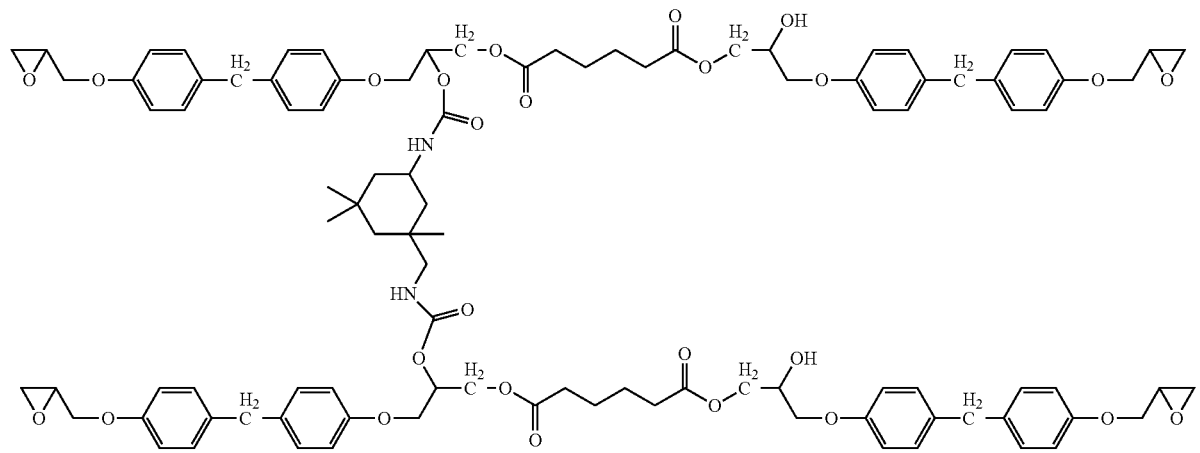

In the ink composition of some embodiments, the amine curing agent is connected to, e.g., covalently bonded to, an epoxy resin such that the ink composition may have a high crosslinking density, and thus serves to improve the strength, durability, barrier properties, and the like of the coating film. The amine curing agent may be a curing agent having a plurality of functional groups, e.g., two, three, four, or more amine groups. For example, the amine curing agent is a curing agent having four amine groups. For example, the amine curing agent may be a triethylenetetramine (TETA). However, the embodiments are not limited thereto. The amine curing agent may be represented by formula 6 below.

Formula 6

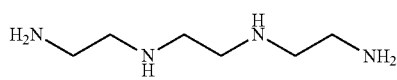

In the mixing of an amine curing agent with an epoxy resin, the epoxy group of the epoxy resin and the amine curing agent may react to form a crosslink, e.g., a covalent crosslink. More specifically, the epoxy groups positioned at both ends of the epoxy resin may react with the amine groups of the curing agent to form a plurality of crosslinks. In the ink composition of embodiments, the amine curing agent has a plurality of functional groups, for example, four amine groups, and the epoxy resin has two epoxy groups at both ends, so that the epoxy resin and the amine curing agent Formula 7

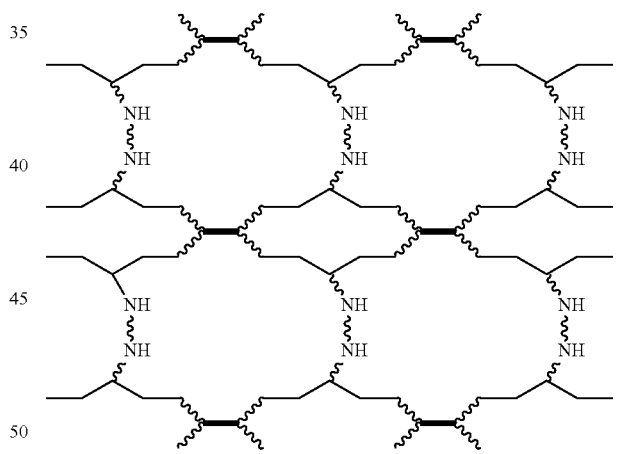

The ink composition according to an embodiment may further include one or more additives as known in the art, for example a pigment, a dispersant, a filler, a defoamer, or the like. In some embodiments the ink composition may further include a pigment such as carbon black, a carbon black dispersant, a defoamer, a barium sulfate filler, or a combination thereof. In the preparation method of an ink composition of embodiments, before the mixing of an epoxy resin and an amine curing agent, an epoxy resin, an isophorone solvent, a carbon black dispersant, a defoamer, a barium sulfate filler, carbon black, or a combination thereof may be mixed, e.g., included.

The carbon black may be included as a pigment of the ink composition. The ink composition of embodiments includes carbon black and may be used to form a shielding ink layer for shielding light. In the ink composition according to an embodiment, one or more known pigments other than carbon black or a mixture thereof may be used as the pigment.

The carbon black dispersant serves to uniformly disperse the carbon black pigment in the ink. The defoamer serves to break, e.g., eliminate, air bubbles generated in the composition to prevent the appearance of defects during the formation of the coating film. The barium sulfate filler is an inert material that adjusts, e.g., changes, the viscosity and the like of the ink composition and prevents cracking and the like during the formation of the coating film.

The ink composition according to an embodiment is used in a process of fabricating a window member applied to a display device, and specifically, the ink composition may be used to form a shielding ink layer forming a decoration pattern in the bezel area of the widow member. However, the use of the ink composition according to an embodiment is not limited thereto.

In the ink composition according to an embodiment, before a crosslink between the epoxy group and the amine group of the epoxy resin is formed through the amine curing agent, a urethane crosslinking moiety with the hydroxyl group of the epoxy intermediate is formed through the polyisocyanate. Therefore, in the epoxy resin included in the ink composition according to an embodiment, a hydrogen atom may be connected to the amine group positioned at the urethane crosslink to be hydrogen bonded with other materials. More specifically, in the ink composition of embodiments, a hydrogen atom capable of hydrogen bonding may be included, thus being hydrogen bonded with the hydrogen atom included in an acryl adhesive and the like, so that the bonding force with an adhesive and the like may be strengthened. Also, the epoxy resin includes a urethane crosslinking moiety, thus increasing the crosslinking density of the ink composition, so that the barrier property to the external material may be improved.

Hereinafter, a window member and a fabrication method thereof according to an embodiment will be described.

Figure 2:
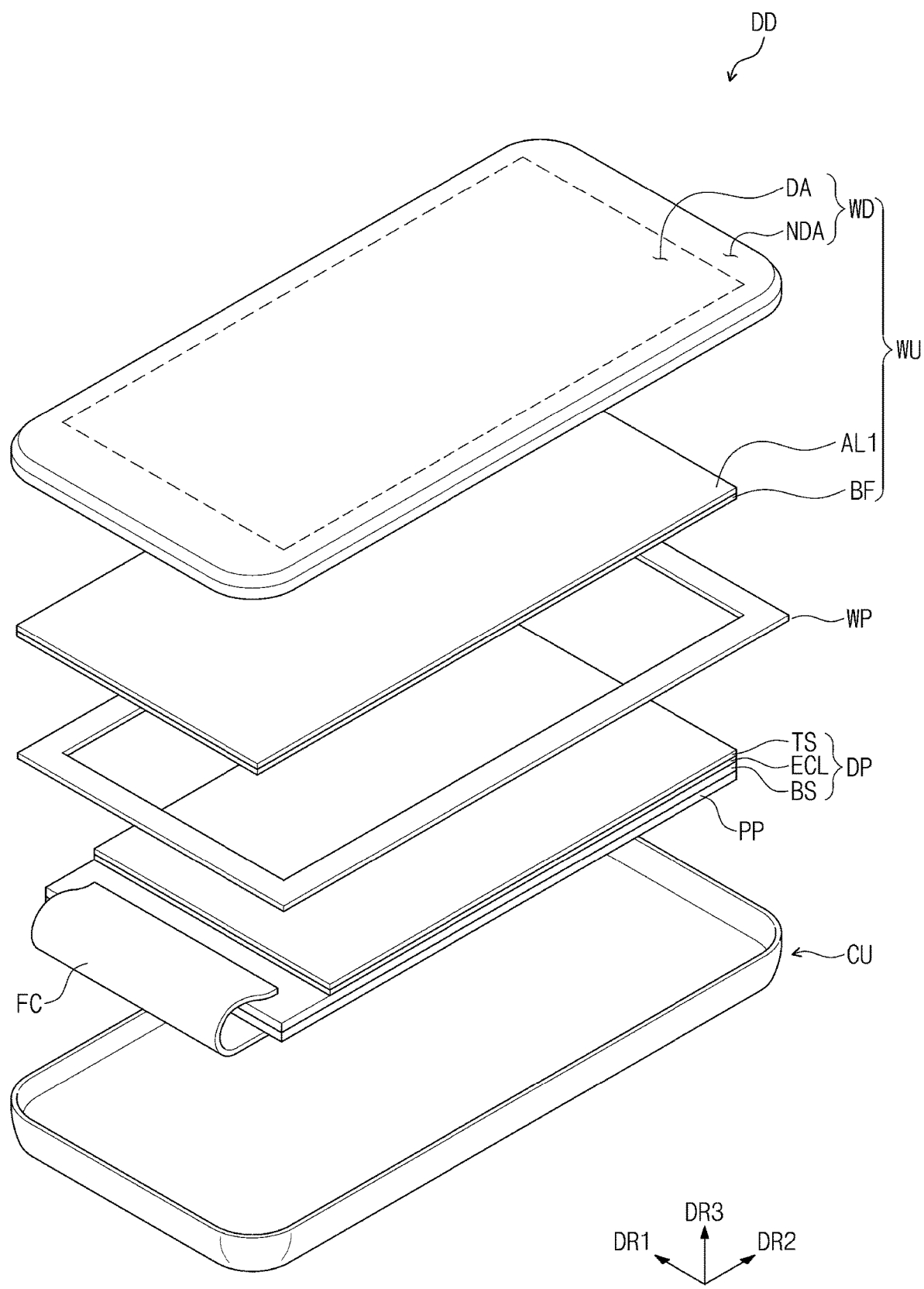
FIG. 2 is an exploded perspective view of the display device illustrated in FIG. 1.
Figure 3:
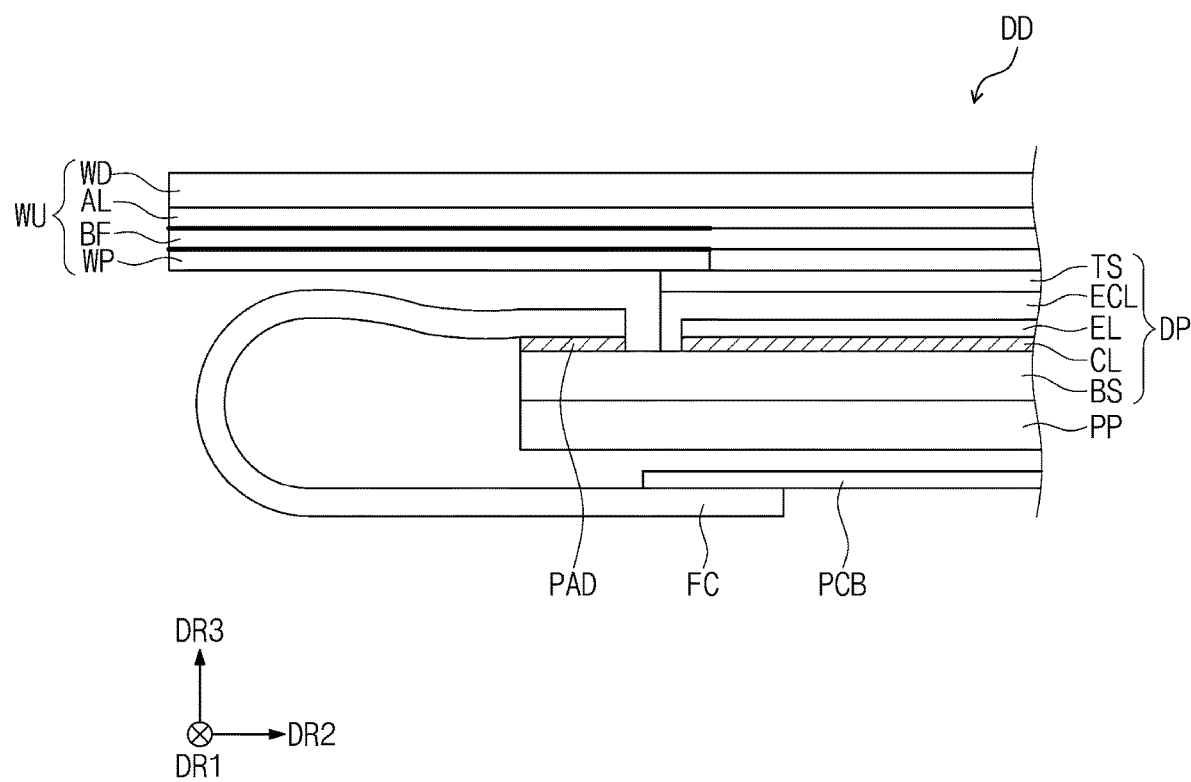
FIG. 3 is a cross-sectional view illustrating a part of component of the display device represented in FIG. 1.

FIG. 1 is a perspective view of a display device including a window member according to an embodiment. FIG. 2 is an exploded perspective view of the display device illustrated in FIG. 1. FIG. 3 is a cross-sectional view illustrating a part of component of the display device illustrated in FIG. 1. Hereinafter, referring to FIGS. 1 to 3, the display device DD including the window member, e.g., unit, WU according to an embodiment will be described.

As an example of the display device DD according to an embodiment, a flat portable terminal is exemplarily illustrated. However, embodiments are not limited thereto and may be applied to various display devices DD such as a curved display device, a banding display device, a rollable display device, a foldable display device, or a stretchable display device. Further, although not illustrated, the display device DD according to embodiments may be used not only a large electronic device such as a television or an external billboard, but also a small and medium-sized electronic device such as a personal computer, a notebook computer, a personal digital terminal, a car navigation unit, a game machine, a portable electronic device, a wristwatch electronic device, or a camera. These are provided only as examples, and embodiments may be applied to other electronic apparatuses.

The display device DD includes a plurality of regions divided on the display surface. The display device DD may include a display region DR for displaying an image IM, and a non-display region NDR adjacent to the display region DR. The display surface for displaying the image IM is parallel to a surface defined by a first direction DR1 and a second direction DR2, and a vertical direction of the display surface is indicated by a third direction DR3. The third direction DR3 separates a front surface and a rear surface of the respective members. In the present specification, a surface specified by the second direction DR2 in the first direction DR1 may be defined as a plane, which is viewed in the third direction.

The display device DD may include a display panel DP, a window member WU, and a collection member, e.g., unit, CU.

The display device DD may be divided, on a plane, into a display region overlapping the display region DR of the display device DD, and a non-display region overlapping the non-display region NDR of the display device DD. The display panel DP may provide an image corresponding to the image data input through the display region.

The display panel DP may be employed in various forms such as an organic light emitting display panel, a liquid crystal display panel, a plasma display panel, an electrophoretic display panel, or an electrowetting display panel. In an embodiment, the display panel DP will be described as an example of the organic light emitting display panel.

The display panel DP may include a base substrate BS, a circuit layer CL, an organic light emitting device layer EL, an encapsulation layer ECL, a pad unit PAD, and a touching sensing unit TS.

The base substrate BS may include a glass substrate, a sapphire substrate, a plastic substrate, or a combination thereof. On the base substrate, the circuit layer CL, the organic light emitting device layer EL, the encapsulation layer ECL, the pad unit PAD, and the touching sensing unit TS and the like may be disposed.

The circuit layer CL may include a plurality of signal lines and electronic devices provided in the display panel DP. For example, the circuit layer CL may include thin film transistors corresponding to gate lines, data lines, and pixels, respectively.

The organic light emitting device layer EL may generate light of a color corresponding to a light emitting material. The color may include, but is not limited to, red, green, blue and white.

The encapsulation layer ECL may include a thin film encapsulation layer (TFE), that is, a plurality of inorganic thin films and a plurality of organic thin films. The encapsulation layer ECL covers the organic light emitting device layer EL, blocks air and moisture, and thus may protect the organic light emitting device layer EL. In an embodiment, the encapsulation layer ECL may be replaced by an encapsulation substrate. The encapsulation substrate is spaced apart from the base substrate BS with the organic light emitting device layer in-between. The encapsulation substrate and the base substrate BS are coupled by a sealing agent disposed along the edge of the base substrate BS.

A touch sensing unit TS may be disposed on the encapsulation layer ECL. The position of the touch sensing unit TS is exemplarily illustrated, but is not limited thereto. For example, the touching sensing unit TS may be disposed between the organic light emitting device layer EL and the encapsulation layer ECL, or may be disposed between the base substrate BS and the circuit layer CL. Further, the touching sensing unit TS may be included in the window member WU instead of the display panel DP.

The touching sensing unit TS may acquire the coordinate information of an input point. The touching sensing unit is divided into a resistance film sensor, a capacitance sensor, an electromagnetic induction sensor, and the like. In an embodiment, the touching sensing unit may be a capacitance sensor touch panel. The touching sensing unit may include two sensors which cross each other. The capacitance sensor touch panel may acquire the coordinate information of the point touched by a self-capacitance method or a mutual-capacitance method.

Although not illustrated, the display panel may include an optical member. The optical member may be disposed on the touching sensing unit TS. However, the position of the optical member is not limited thereto. The optical member may include a phase retardation plate, a polarization plate, or a combination thereof. When the optical member includes both the phase retardation plate and the polarization plate, the polarization plate may be disposed on the phase retardation plate. External light incident from the outside of the window member WU is linearly polarized while passing through the polarization plate. The linearly-polarized incident light is reflected after passing through the phase retardation plate and is incident on the polarization plate after passing through the phase retardation plate again. The linearly-polarized incident light has a phase difference of 45° while passing through the phase retardation plate, is circularly polarized, and thus a phase thereof is changed. As a result, after passing through the phase retardation plate again, the external light does not pass through the polarization plate and mostly disappears. For example, right-turning circularly-polarized light is reflected while passing through the phase retardation plate to be changed into left-turning circularly-polarized light, and the right-turning circularly-polarized light and the left-turning circularly-polarized light may be disappeared by the destructive interference. Therefore, the external light reflectance of the display device DD is reduced.

The pad unit PAD may include pads electrically connected to each other in a one-to-one correspondence with multiple signal lines electrically connected to a plurality of pixels. The pad unit PAD may be electrically connected to a flexible circuit board FC.

The flexible circuit board FC may be attached on one end of the display panel DP, and bent to the rear surface of the display panel DP. The flexible circuit board FC may be electrically connected with the pad unit PAD, and receive signals for driving the display panel DP from a driving, e.g., printed, circuit board PCB. Further, the flexible circuit board FC may transfer the signals to the display panel DP. A data driving chip (not illustrated) may be mounted on one surface of the flexible circuit board FC. The data driving chip may generate a data signal applied to the data lines of the display panel DP in response to an external signal.

The driving circuit board PCB may be disposed on the rear surface of the display panel DP. The driving circuit board PCB may be electrically connected with the display panel DP by the flexible circuit board FC. The driving circuit board PCB may provide an image signal for displaying an image on the display panel DP and a control signal for driving the display panel DP.

The driving circuit board PCB includes a base substrate, and the base substrate may be a flexible printed circuit board. In this case, the base substrate may be a flexible plastic substrate such as polyimide or polyester.

A protective member, e.g., panel, PP may be disposed between the display panel DP and the driving circuit board PCB. The protective member PP may include a buffer member, a heat radiation member, or a combination thereof. The buffer member may include a material having a high shock absorption rate. For example, the buffer member may be formed of a polymer resin (for example, polyurethane, polycarbonate, polypropylene, and polyethylene), or a sponge which is foam-molded with a rubber liquid, a urethane material, or an acrylic material, but is not limited thereto.

The heat radiation member may include, but is not limited to, graphite, copper (Cu), aluminum (Al), or a combination thereof having good heat radiation characteristics. The heat radiation member may not only improve heat radiation characteristics, but also have electromagnetic wave shielding or electromagnetic wave absorption characteristics.

The window member WU may be disposed on the display panel DP.

The window member WU may include a cover member, e.g., window display, WD, an adhesive layer AL, a light transmissive film, e.g., barrier film, BF, and a waterproof member, e.g., panel, WP.

The cover member WD may include, but is not limited to, a silicon substrate, a glass substrate, a sapphire substrate, or a plastic film. In embodiments, the cover member WD may be a glass substrate.

The light transmissive film BF may be a transparent film through which light is transmitted. The light transmissive film is not limited to a light transmittance of 100%. For example, the light transmittance of the light transmissive film BF may have a value of 100% or less. The light transmissive film BF may include, but is not limited to, a synthetic resin such as polyethylene terephthalate (PET), polyvinyl chloride (PVC), polypropylene (PP), polyethylene (PE), polycarbonate (PC), or poly(methyl methacrylate) (PMMA).

A print layer may be disposed on one surface of the light transmissive film BF. The description thereof will be described in more detail in FIG. 4 below.

The adhesive layer AL may be disposed between the cover member WD and the light transmissive film BF. The cover member WD and the light transmissive film BF may be attached to each other by the adhesive layer AL. The adhesive layer AL may include an optically clear adhesive film or an optical clear resin.

The collection member, e.g., unit, CU may collect the display panel DP and may be coupled to the window member WU. The collection member CU may include one body in which a plurality of parts is assembled or injection-molded. The collection member CU may include glass, plastic or metal.

Figure 4:
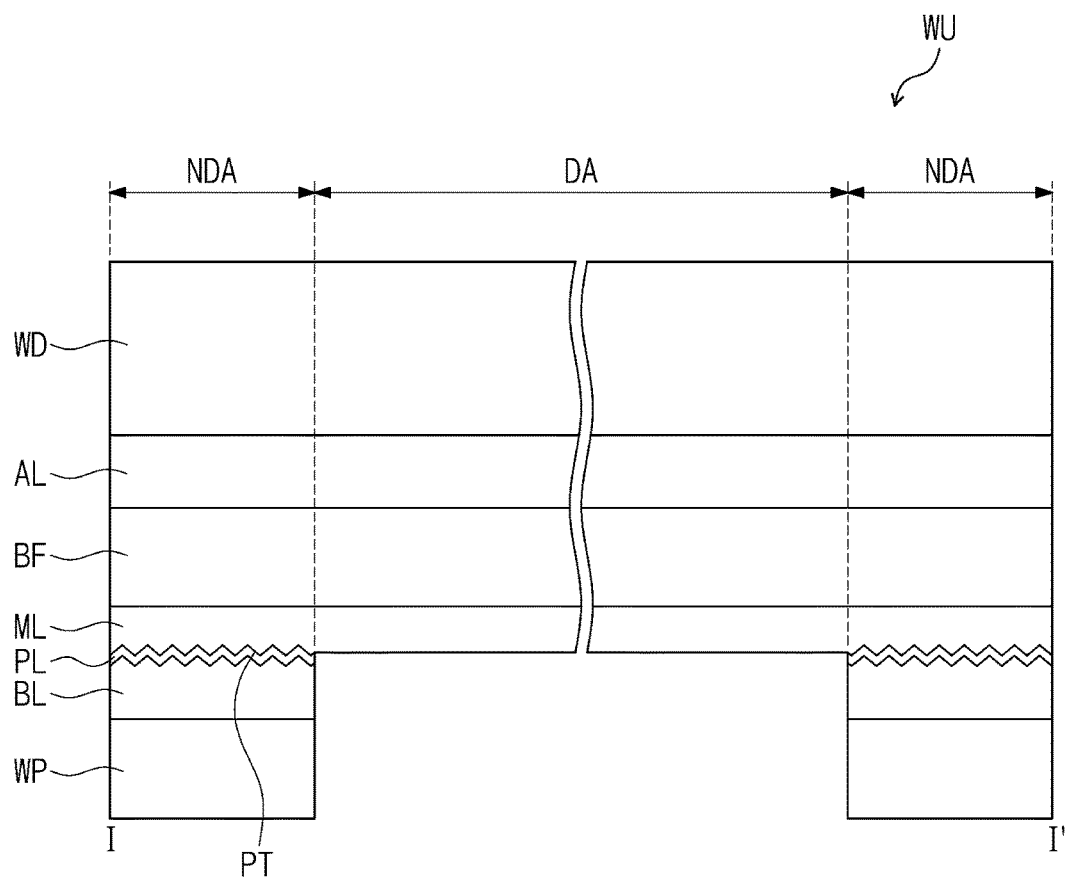
FIG. 4 is a cross-sectional view taken along the line I-I' of FIG. 1.

FIG. 4 is a cross-sectional view taken along the line I-I' of FIG. 1. FIG. 4 illustrates only the window member WU, and the drawings of the display panel DP and the collection member CU described in FIG. 3 are not provided herein. Hereinafter, the window member WU according to an embodiment will be described with reference to FIG. 4. Meanwhile, the same reference numerals are assigned to the same components as those described in FIGS. 1 to 3, and redundant descriptions will not be provided herein.

Referring to FIG. 4, the window member WU may include a cover member WD, an adhesive layer AL, a light transmissive film BF, a background ink, e.g., protection, layer PL, a molding layer ML, and a shielding ink, e.g., blocking, layer BL.

The cover member WD may include a bezel, e.g., non-display, area NDA and a transmissive, e.g., display, area DA defined on a plane. The bezel area NDA may overlap the non-display region NDR of FIG. 1 in advance on a plane, and the transmissive area DA may overlap the display region DR of FIG. 1 on a plane.

The light transmissive film BF is disposed under the cover member WD. That is, the light transmissive film BF may be disposed between the cover member WD and the display panel (DP of FIG. 2). The light transmissive film BF may include one surface and the other surface facing each other. The molding layer ML may be disposed on one surface of the light transmissive film BF, and the adhesive layer AL may be disposed on the other surface thereof.

The molding layer ML may be disposed under one surface of the light transmissive film BF. The molding layer ML may be directly formed on one surface of the light transmissive film BF. Although not illustrated, a primer layer for improving an adhesive force may be further disposed between the molding layer ML and the light transmissive film BF.

One surface of the molding layer ML is in contract with the light transmissive film BF, and a pattern PT may be provided on the other surface of the molding layer ML. The pattern PT may overlap the bezel area NDA on a plane when being viewed from the third direction DR3. FIG. 4 illustrates that the pattern PT overlaps the bezel area NDA on a plane and does not overlap the transmissive area DA, but is not limited thereto, and the pattern overlapping the transmissive area DA may be provided.

The pattern PT may irregularly reflect incident light from the outside. FIG. 4 illustrates exemplarily that the pattern PT has a prism shape, but is not limited thereto. The pattern PT is a decoration pattern, which may be deformed into various patterns such as a three-dimensional pattern formed of a fine line, e.g., having the thickness of a hair, or a wavy pattern.

The background ink layer PL may be disposed under the pattern PT. The background ink layer PL may be disposed on a plane to overlap the bezel area NDA on a plane. The background ink layer PL may include a material having a predetermined color. Further, the background ink layer PL may include a reflective material. The background ink layer PL may reflect or adsorb light incident from the outside. The background ink layer PL may have a structure in which at least one or at least two layers are laminated.

The shielding ink layer BL may be disposed under the background ink layer PL. The shielding ink layer BL may have a black color, but is not limited thereto. The shielding ink layer BL is disposed under the background ink layer PL, so that the color of one area of the window member WU may be seen more clearly.

The shielding ink layer BL may be formed through an ink composition according to an embodiment. The above description may be applied without change, so that a detailed description of the ink composition will not be provided herein.

The shielding ink layer BL may be formed through a print process under the background ink layer PL, but is not limited thereto. The shielding ink layer BL may be provided as a predetermined subsidiary material. In this case, the shielding ink layer BL may be attached under the background ink layer PL.

The window member WU may be fabricated in various colors according to the demand of the user. For example, one area of the window member WU overlapping the bezel area NDA may be seen in various colors such as white, black, blue, gold, pink, or green. The various colors of one area overlapping the window member WU may be achieved through the pattern PT formed on one surface and the background ink layer PL disposed on the pattern PT.

The waterproof member WP may be disposed under the shielding ink layer BL. The waterproof member WP may be disposed in the window member WU to prevent moisture from entering into the display device DD. The waterproof member WP may be disposed under the shielding ink layer BL to overlap the bezel area NDA. That is, the waterproof member WP may be disposed along the edge of the window member WU to prevent a component such as a circuit included inside the display device DD from being damaged due to moisture.

Figure 5:
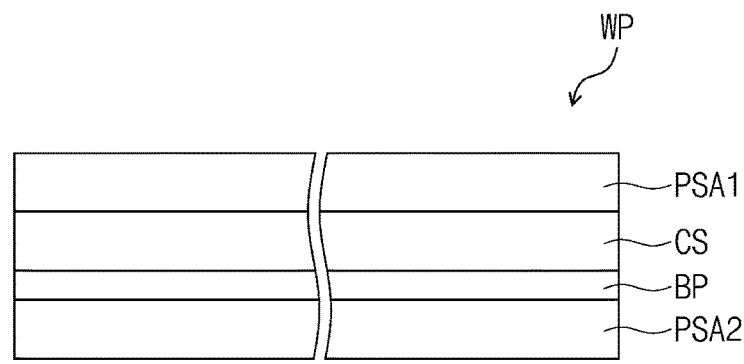
FIG. 5 is a cross-sectional view illustrating a waterproof member illustrated in FIG. 4.

FIG. 5 is cross-sectional view illustrating the waterproof member illustrated in FIG. 4. FIG. 5 illustrates each of the components included in the waterproof member WP illustrated in FIG. 4 as a layer structure.

The waterproof member WP may include a first pressure-sensitive adhesive layer PSA1, a cushion layer CS, a base layer BP, and a second pressure-sensitive adhesive layer PSA2.

The waterproof member WP may include the base layer BP and the cushion layer CS to prevent moisture from penetrating into the side surface of the window member WU, and may play a role to, e.g., help, absorb the shock caused by an external impact.

The first pressure-sensitive adhesive layer PSA1 and the second pressure-sensitive adhesive layer PSA2 are disposed in the side surface of the waterproof member WP. The first pressure-sensitive adhesive layer PSA1 and the second pressure-sensitive adhesive layer PSA2 may be an acryl resin adhesive layer. An acryl resin may be included in the first pressure-sensitive adhesive layer PSA1 and the second pressure-sensitive adhesive layer PSA2, and a hydrogen atom capable of hydrogen bonding may be included in the acryl resin.

Each of the first and second pressure-sensitive adhesive layers PSA1 and PSA2 disposed on both sides of the waterproof member WP may contact the display panel DP and the shielding ink layer BL of the display device DD to play a role to attach the window member WU and the display panel DP.

Figure 6:
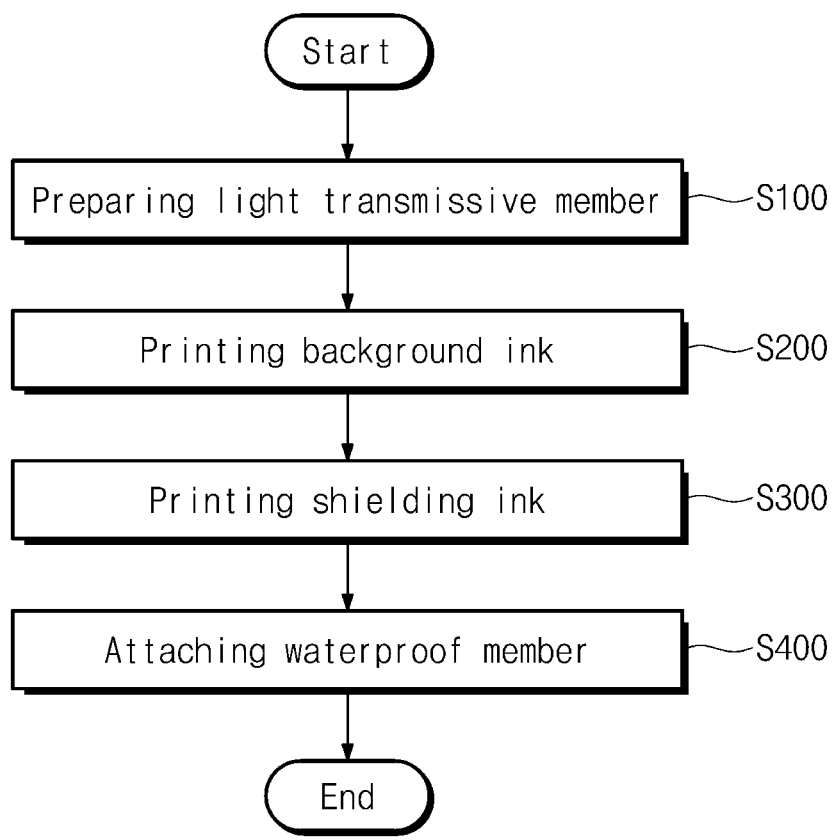
FIG. 6 is a flowchart illustrating a fabrication method of a window member, according to an embodiment.
Figure 7A:
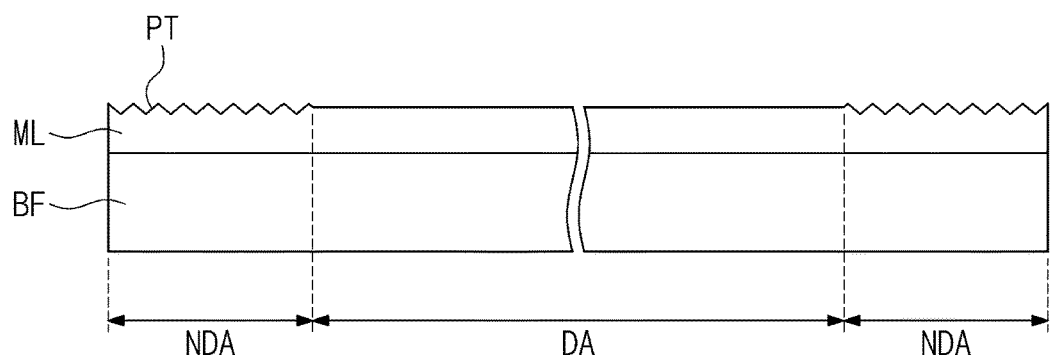
FIG. 7A to FIG. 7C are cross-sectional views sequentially illustrating a fabrication method of a window member, according to an embodiment.
Figure 7A:
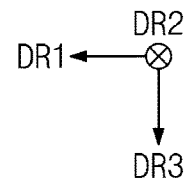
Figure 7B:
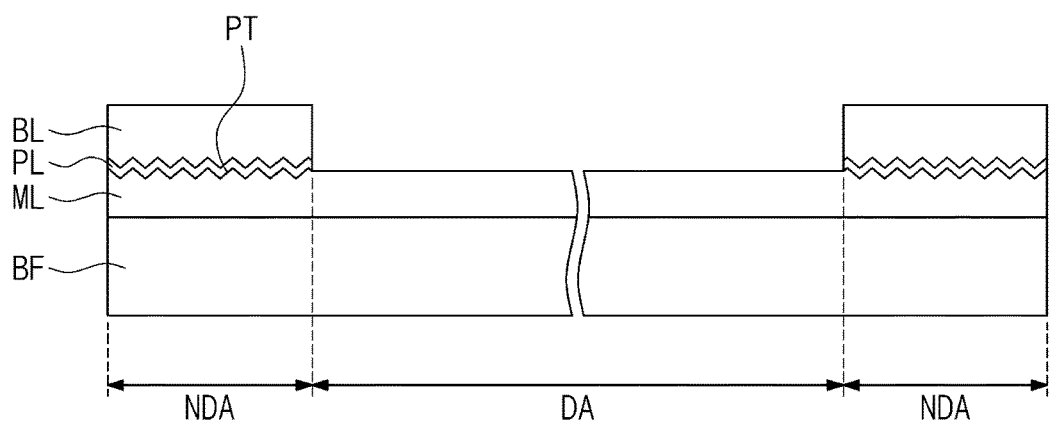
Figure 7B:
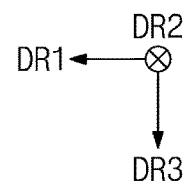
Figure 7C:
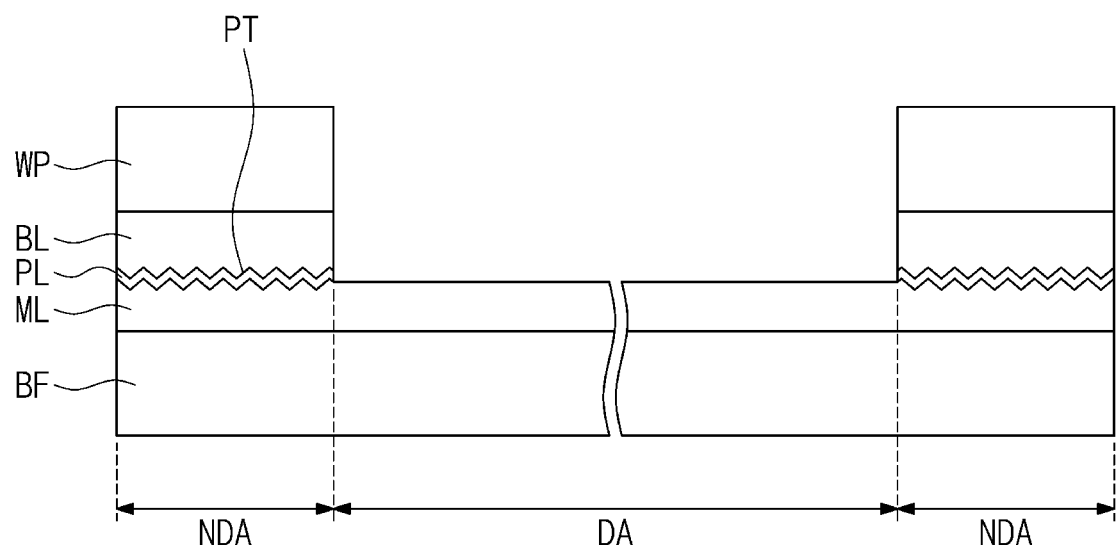
Figure 7C:
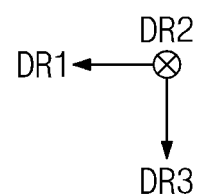

FIG. 6 is a flowchart illustrating a fabrication method of a window member according to an embodiment. FIGS. 7A to 7C are cross-sectional views sequentially illustrating a fabrication method of a window member according to an embodiment. Hereinafter, a fabrication method of a window member according to an embodiment will be described with reference to FIGS. 6 to 7.

As illustrated in FIG. 6, a fabrication method of a window member according to an embodiment includes preparing a light transmissive film (S100), printing a background ink (S200), printing a shielding ink (S300), and attaching a waterproof member (S400).

Referring to FIGS. 6 and 7A, after the preparing of the light transmissive film (S100), the molding layer ML may be formed on one surface of the prepared light transmissive film BF. The molding layer ML may be formed through an ultraviolet curing process after applying a photo-curable resin composition. Upon forming the molding layer ML, a predetermined pattern may be formed on a portion of area of the photo-curable resin composition applied before curing the photo-curable resin composition, and then a pattern PT may be formed by curing the predetermined pattern. The pattern PT may be formed so as to overlap the bezel area NDA overlapping the non-display region NDR (see FIG. 1). However, the pattern is not limited thereto, and may be formed so as to overlap the transmissive area DA. The photo-curable resin composition may be an acryl resin composition.

Referring to FIGS. 6 and 7B, the background ink is printed on one surface of the prepared light transmissive film BF to form a background ink layer PL, and the shielding ink according to an embodiment is printed on the background ink layer PL to form a shielding ink layer BL.

The background ink layer PL may be formed by depositing an organic material or an inorganic material. For example, the background ink layer PL may be formed of an organic material having a predetermined color, or may be formed by depositing a reflective metal oxide and the like.

The shielding ink layer BL may be formed by printing an ink composition according to an embodiment. The above description of the ink composition is applied without change, so that the detailed description thereof will not be provided herein.

Referring to FIG. 7C, a waterproof layer WP is attached to a shielding ink layer BL. The waterproof layer WP may be attached to the shielding ink layer BL by a second pressure-sensitive adhesive layer PSA2 (see FIG. 5). The second pressure-sensitive adhesive layer PSA2 corresponds to an acryl adhesive layer, and the shielding ink layer BL may be formed of an epoxy ink composition.

Although not illustrated, a cover member WD (see FIG. 4) may be attached to the other surface of the light transmissive film BF. The cover member WD may be attached to the other surface opposite to one surface in which a molding layer ML, a background layer PL, a blocking layer BL and a waterproof layer WP are formed. The cover member WD may be attached to the light transmissive film BF through the adhesive layer AL (see FIG. 4). The adhesive layer AL may include an optically clear adhesive film or an optical clear resin.

Figure 8:
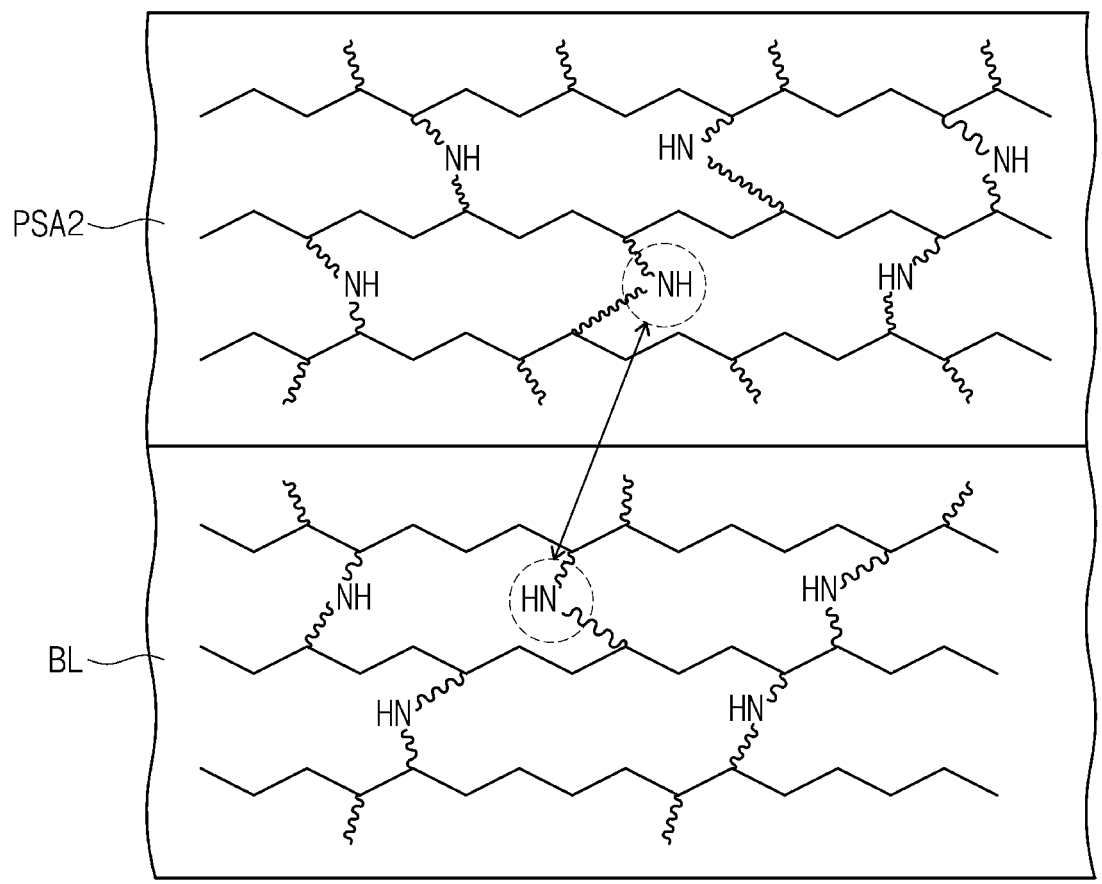
FIG. 8 is an enlarged cross-sectional view schematically illustrating a part of component of a window member, according to an embodiment.

FIG. 8 is an enlarged cross-sectional view schematically illustrating a part of component of a window member, according to an embodiment.

The window member according to an embodiment forms a shielding ink layer through the ink composition in which a hydroxyl group of the epoxy intermediate is crosslinked with a urethane moiety through a polyisocyanate. The ink composition according to an embodiment is based on a resin structure in which an epoxy resin is crosslinked through an amine curing agent, but before a crosslink between the epoxy group and the amine group of the epoxy resin is formed, a hydroxyl group is crosslinked with a urethane moiety through the polyisocyanate, and a hydrogen atom capable of hydrogen bonding is included in the ink composition. Therefore, as described in FIG. 8, a hydrogen atom capable of hydrogen bonding included in the second pressure-sensitive adhesive layer PSA2, and a hydrogen atom capable of hydrogen bonding included in the shielding ink layer BL formed of the ink composition according to an embodiment may be hydrogen bonded. Thus, a bonding force between the shielding ink layer BL and a lower member such as a waterproof member may be improved.

Hereinafter, the ink composition according to an embodiment will be described in detail with reference to Examples and comparative Examples. The following examples are only illustrative examples to allow for a clear understanding of an embodiment, and the scope of embodiments is not limited thereto.

Preparation of Ink Composition

EXAMPLE

In this example, an ink composition was prepared by using the crosslinked bisphenol A epoxy resin and the bisphenol F epoxy resin having a urethane group as described above. Specifically, the ink composition was prepared by mixing an epoxy intermediate, carbon black, a carbon dispersant, a defoamer, a solvent, and a filler in the amounts shown in Table 1 below.

TABLE 1

|   | Ingredient | Amount |
|---|---|---|
| 1 | Epoxy resin | 600 g |
| 2 | Carbon black | 150 g |
| 3 | Carbon dispersant | 20 g |
| 4 | Defoamer | 10 g |
| 5 | Solvent (Isophorone) | 120 g |
| 6 | Filler (Barium sulfate) | 100 g |
|   | Total | 1,000 g |

In this example, an epoxy resin and a solvent were placed in a 2,000 cubic centimeter (cc) container and stirred. Then, a carbon dispersant and a defoamer were added thereto while stirring, and then barium sulfate as a filler was slowly added thereto, followed by further stirring for 30 minutes. After addition of carbon black, the mixture was further stirred for 30 minutes, and the resulting mixture was dispersed three times by using a 3 roll mill and the particle size did not exceed 3 microns. When the particle size is large, the number of times of dispersions is increased and the dispersion is continuously performed until the particle size does not exceed 3 microns.

5 grams (g) of triethylenetetramine (TETA) per 100 g of the main ink composition as prepared above was added, 10 g of diethylene glycol monoethyl ether acetate was added as a diluent, and the mixture was stirred for 5 minutes to complete an ink composition.

Comparative Example 1

In the preparation method of Example, an ink composition was prepared in the same manner as in Example, except that a bisphenol A epoxy monomer was used instead of an epoxy resin.

Comparative Example 2

In the preparation method of Example, an ink composition was prepared in the same manner as in Example, except that a bisphenol A epoxy intermediate was used instead of a crosslinked epoxy resin having a urethane group.

Comparative Example 3

In the preparation method of Example, an ink composition was prepared in the same manner as in Example, except that a bisphenol F epoxy intermediate was used instead of a crosslinked epoxy resin having a urethane group.

Evaluation of Adhesive Force

The ink compositions of Examples 1 and 2 and Comparative Examples 1 to 3 is printed on a tempered glass, then cured for 150 to 30 minutes, and two ink layers each having a thickness of about 5 microns were printed to fabricate a printing layer having a total thickness of about 10 microns. In order to evaluate the adhesion of the ink layer depending on the ink compositions of Examples 1 and 2 and Comparative Examples, the tape on the ink layer was cut to widths of 25 millimeters (mm) and 5 mm and a length of 150 mm, then attached by spreading evenly on the black ink surface of the printing specimen, and pressed by 2-3 times with a weight of 2 kilogram (kg) load. The adhesive force of the unit prepared as described above was measured after 30 minutes, 1 day, 2 days, and 3 days after and the results are shown in Table 2 below. The adhesive force was measured by using a universal physical property measuring device and evaluated by pulling at a speed of 300 millimeters per minute (mm/min) in a 180° state, e.g., at an angle of 180°. Specifically, the adhesive force measurement was carried out according to ASTM D330 (180° peel test).

TABLE 2

| | Epoxy | 5 times evaluation result (average) 25 mm | 5 times evaluation result (average) 5 mm | Adhesion force determination |
|---|---|---|---|---|
| Example 1 | Bisphenol A epoxy resin | 3,800 gf | 620 gf | Excellent |
| Example 2 | Bisphenol F epoxy resin | 3,900 gf | 630 gf | Excellent |
| Comparative Example 1 | Bisphenol A epoxy monomer | 2,850 gf | 510 gf | X |
| Comparative Example 2 | Bisphenol A epoxy intermediate | 3,300 gf | 550 gf | Good |
| Comparative Example 3 | Bisphenol F epoxy intermediate | 3,350 gf | 560 gf | Good |

Referring to Table 2, when an ink composition was prepared through bisphenol A epoxy resin or bisphenol F epoxy resin crosslinked through isocyanate as in Examples 1 and 2, it was ascertained that the ink composition had a high adhesive force of 3,500 gram-force (gf) or greater for a 25 mm tape and 600 gf or greater for a 5 mm tape.

In the case of an ink composition in which an epoxy monomer is crosslinked through an amine curing agent as in Comparative Example 1, the adhesive force is less than the adhesive force in Examples 1 and 2, an adhesion force of 3,000 gf on the basis of 25 mm tape may not be secured, and the ink composition was not capable of being applied to a shielding ink of the window member. With respect to Comparative Examples 2 and 3, in the case of a composition obtained by crosslinking an epoxy intermediate, which connects an epoxy monomer to an adipic acid, through an amine curing agent, the measured adhesive force was improved relative to Comparative Example 1, but decreased relative to Examples 1 and 2 including a urethane crosslinking moiety.

Evaluation of Barrier Property

With respect to the ink layer prepared by using the ink compositions prepared in the Example and Comparative Examples, the performance of an ultraviolet (UV) curable resin having a molecular weight of about 100 to 200 was evaluated as a barrier film to efficiently block penetration of the resin. The barrier property was evaluated by using an isobornyl acrylate (molecular weight: 208) monomer, which is a monofunctional group UV curable resin. First, a UV curing initiator was added to isobornyl acrylate, followed by stirring for 3 hours, and 1 g of the prepared UV curable resin monomer was dropped on the shielding ink layer. Thereafter, an object (for example, a flexible printed circuit board (FPCB), etc.) capable of shielding was placed on a glass and left for 3 hours, the monomer was irradiated with UV light at a power of about 3,000 millijoule per square centimeter (mJ/cm$^2$), and placed in a 70 oven for 3 hours. Thereafter, it was observed whether or not there was a black ink stain on the glass surface, and the results were shown in Table 3.

TABLE 3

| | Epoxy | Resin penetration results |
|---|---|---|
| Example 1 | Bisphenol A epoxy resin | No occurrence |
| Example 2 | Bisphenol F epoxy resin | No occurrence |
| Comparative Example 1 | Bisphenol A epoxy monomer | No occurrence |
| Comparative Example 2 | Bisphenol A epoxy intermediate | Penetration occurrence |
| Comparative Example 3 | Bisphenol F epoxy intermediate | Penetration occurrence |

From the results of Table 3, it was ascertained that the barrier property was good, and thus the UV curable resin did not penetrate the glass when an ink composition was prepared through the bisphenol A epoxy resin or the bisphenol F epoxy resin crosslinked through isocyanate as in Examples 1 and 2.

In Comparative Examples 2 and 3 which were not crosslinked through isocyanate, due to a lower crosslinking density than that in Examples 1 and 2, the barrier property was decreased and thus the property of blocking penetration by a UV curable monomer was reduced, penetration occurred, and a black ink stain was observed on the glass surface.

According to the ink composition according to an embodiment, a shielding ink layer in which adhesion property and barrier property are improved and physical properties are not deteriorated even under external shock and high humidity conditions may be formed.

According to the fabrication method of a window member according to an embodiment, a shielding ink layer with improved adhesion and barrier properties may be provided, design characteristics and reliability of the product may be improved, and excellent stability and yield ratio may be secured.

In the foregoing, the present invention has been described with reference to exemplary embodiments thereof. It will be however understood by those skilled in the art that various changes in form and details may be made therein without departing from the spirit and scope of the invention as defined in the following claims. Accordingly, it can be also understood that the technical scope of the present invention should not be limited to the contents described in the detailed description of the specification, but should be defined by the claims.

What is claimed is:

1. An ink composition, comprising:
   an epoxy resin; and
   an amine curing agent,
   wherein the epoxy resin is a reaction product of a bifunctional epoxy monomer, 10 to 50 parts by weight of an adipic acid, and 5 to 30 parts by weight of a polyisocyanate, based on 100 parts by weight of the bifunctional epoxy monomer.

2. The ink composition of claim 1, wherein the amine curing agent is present from 10 to 30 parts by weight.

3. The ink composition of claim 1, wherein the bifunctional epoxy monomer is a bisphenol A epoxy monomer, or a bisphenol F epoxy monomer.

10. The ink composition of claim 1, further comprising a carbon black dispersant, and the one or more pigments includes carbon black.

11. The ink composition of claim 1, wherein the epoxy resin comprises an epoxy resin of Formula 5-A or Formula 5-F Formula 5-A

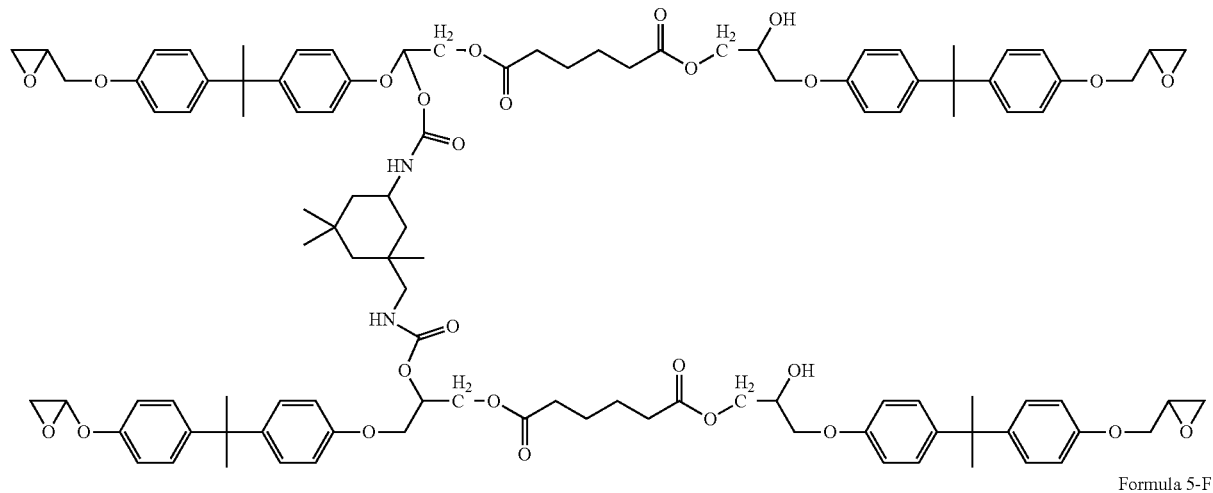

Formula 5-F

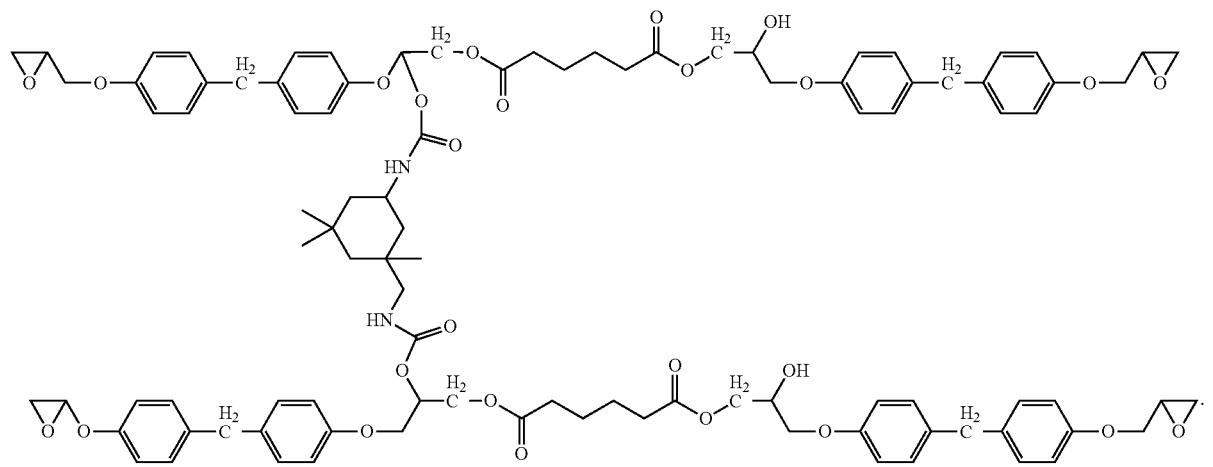

4. The ink composition of claim 1, wherein the polyisocyanate is a diisocyanate.

5. The ink composition of claim 1, wherein the polyisocyanate is isophorone diisocyanate, toluene diisocyanate, dimeryl diisocyanate, hexamethylene diisocyanate, or a combination thereof, and the amine curing agent is triethylenetetramine.

6. The ink composition of claim 1, further comprising carbon black, a carbon black dispersant, a defoamer, an isophorone solvent, and a barium sulfate filler.

7. The ink composition of claim 1, wherein the epoxy resin comprises a urethane bond, wherein the urethane bond includes a hydrogen atom connected to a nitrogen atom.

8. The ink composition of claim 1, wherein the adipic acid is present from 20 to 25 parts by weight, and the polyisocyanate is present from 7 to 15 parts by weight, based on 100 parts by weight of the bifunctional epoxy monomer.

9. The ink composition of claim 1, further comprising one or more pigments.

12. An ink composition, comprising:
an epoxy resin;
an amine curing agent; and
one or more pigments;
wherein the epoxy resin is a reaction product of 100 parts by weight of a bifunctional epoxy monomer, 10 to 50 parts by weight of an adipic acid, and 5 to 30 parts by weight of a diisocyanate.

13. The ink composition of claim 12, wherein the bifunctional epoxy monomer is a bisphenol A epoxy monomer or a bisphenol F epoxy monomer, and the diisocyanate is isophorone diisocyanate, toluene diisocyanate, dimeryl diisocyanate, hexamethylene diisocyanate, or a combination thereof, and the amine curing agent is present from 10 to 30 parts by weight.

14. The ink composition of claim 12, further comprising a carbon black dispersant, and the one or more pigments includes carbon black.

15. A preparation method of an ink composition, the method comprising:
preparing an epoxy resin; and
mixing an amine curing agent with the epoxy resin,
wherein the preparing the epoxy resin includes mixing a bifunctional epoxy monomer with 10 to 50 parts by weight of an adipic acid to form an epoxy intermediate; and mixing 5 to 30 parts by weight of a polyisocyanate, based on 100 parts by weight of the bifunctional epoxy monomer with the epoxy intermediate to form the epoxy resin.

16. The method of claim 15, wherein in the forming of the epoxy intermediate, the epoxy group of the bifunctional epoxy monomer reacts with the carboxylic group of the adipic acid to form an ester bond, and in the mixing of the amine curing agent with the epoxy resin, the epoxy group of the epoxy resin reacts with the amine curing agent to form a bond.

17. The method of claim 15, wherein in the forming of the epoxy resin, the epoxy intermediate is mixed with the diisocyanate at a molar ratio in a range of 1:0.30 to 1:0.45.

18. The method of claim 15, wherein before the mixing of the amine curing agent with the epoxy resin, the method further comprises mixing an isophorone solvent, a carbon black dispersant, a defoamer, a barium sulfate filler, carbon black, or a combination thereof, with the epoxy resin.

19. The method of claim 15, wherein in the forming of the epoxy intermediate, the bifunctional epoxy monomer is mixed with adipic acid at a molar ratio of 2:1, and the epoxy intermediate comprises two hydroxyl groups.

20. The method of claim 19, wherein in the forming of the epoxy resin, the hydroxyl group of the epoxy intermediate reacts with the polyisocyanate to form a urethane bond.

* * * * *